United States Patent [19]

Cooper, Jr. et al.

[11] 4,291,247
[45] Sep. 22, 1981

[54] MULTISTAGE LOGIC CIRCUIT ARRANGEMENT

[75] Inventors: James A. Cooper, Jr.; Robert H. Krambeck, both of Warren, N.J.

[73] Assignee: Bell Telephone Laboratories, Incorporated, Murray Hill, N.J.

[21] Appl. No.: 77,753

[22] Filed: Sep. 21, 1979

Related U.S. Application Data

[63] Continuation-in-part of Ser. No. 860,339, Dec. 14, 1977, abandoned.

[51] Int. Cl.³ ................. H03K 19/017; H03K 19/096
[52] U.S. Cl. .................................... 307/481; 307/443; 307/452
[58] Field of Search ................ 307/203, 205, 208, 215

[56] References Cited

U.S. PATENT DOCUMENTS

| | | | |
|---|---|---|---|
| 3,518,451 | 6/1970 | Booher | 307/205 X |
| 3,551,693 | 12/1970 | Burns et al. | 307/205 |
| 3,601,627 | 8/1971 | Booher | 307/205 |
| 3,852,625 | 12/1974 | Kubo | 307/205 X |
| 3,883,802 | 5/1975 | Puri | 307/205 X |
| 3,917,958 | 11/1975 | Hatsukano | 307/205 |
| 3,943,377 | 3/1976 | Suzuki | 307/205 |
| 3,989,955 | 11/1976 | Suzuki | 307/205 |
| 4,040,015 | 8/1977 | Fukuda | 307/205 X |
| 4,069,429 | 1/1978 | White et al. | 307/205 X |
| 4,140,927 | 2/1979 | Feucht | 307/205 X |

OTHER PUBLICATIONS

Lohman, "Applications of MOS FET's in Microelectronics"; *SCP and Solid-State Technology*; pp. 23-29; 3/1966.
*MOS Integrated Circuits-Microelectronics Series-*1972; "2-Phase Ratioed Logic"; p. 262.

*Primary Examiner*—Larry N. Anagnos
*Attorney, Agent, or Firm*—Herbert M. Shapiro

[57] ABSTRACT

Logic circuits, particularly of the integrated semiconductor type, are accessed at improved speeds by preventing pull-ups from occurring during the access time and by the inclusion of on-chip delay circuitry to avoid switching later stages in a manner to lose information while output nodes of earlier stages are high. All stages are activated in response to a single clock pulse edge.

6 Claims, 5 Drawing Figures

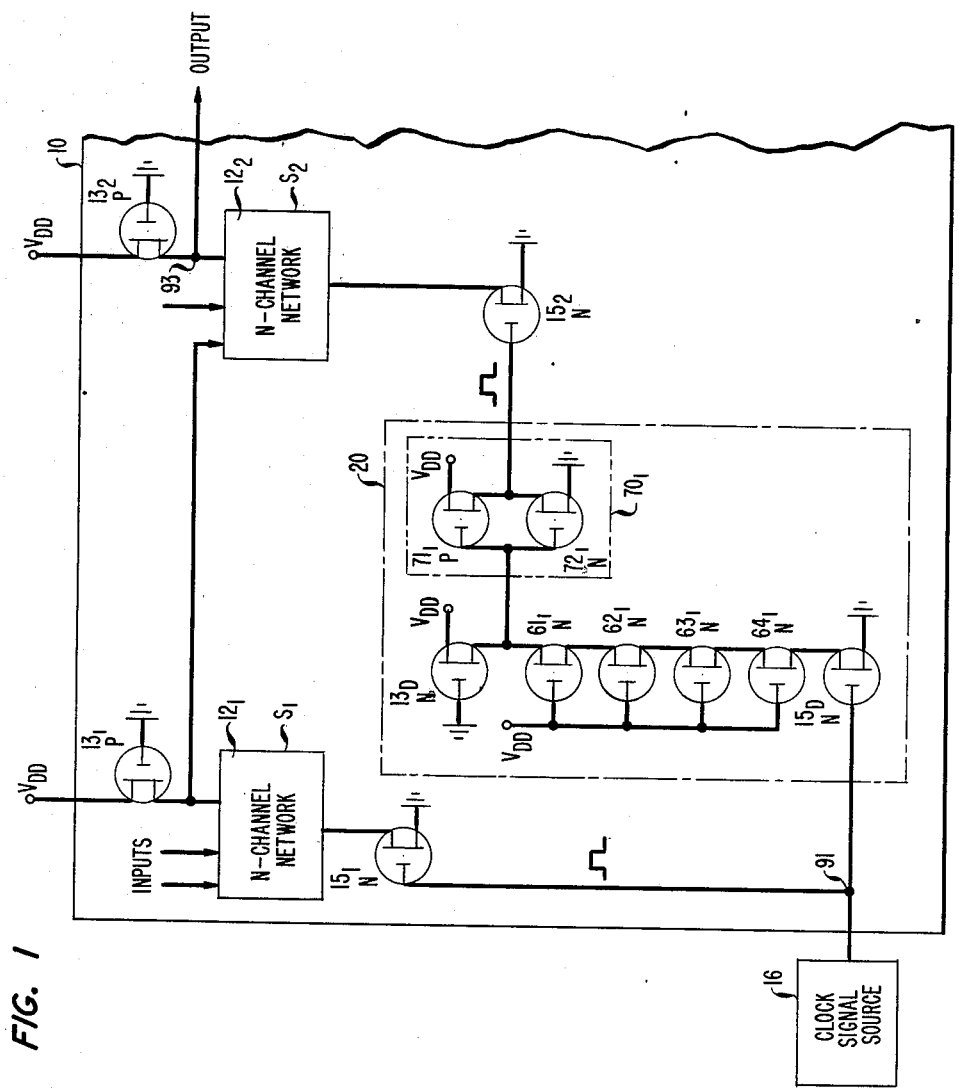
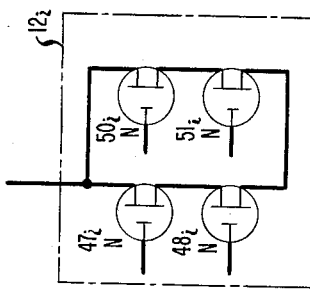
FIG. 1
FIG. 2

MULTISTAGE LOGIC CIRCUIT ARRANGEMENT

CROSS REFERENCE TO RELATED APPLICATION

This application is a continuation-in-part of patent application Ser. No. 860,339, filed Dec. 14, 1977, and now abandoned.

TECHNICAL FIELD

This invention relates to integrated semiconductor circuits.

BACKGROUND OF THE INVENTION

A typical semiconductor circuit such as, for example, an integrated logic circuit includes an output node which is driven to high and low states frequently during operation. The node is connected to a reference potential, typically ground, via a logic network comprising a group of logically interconnected transistor switches, and an active element. The network is operative to ground the node responsive to logic inputs thereto when the active element is activated. The node also is connected by means of a load device to a supply voltage for raising the level of the node when the switch is deactivated.

Typically, a passive load is employed in the supply circuit and a current flows through the load when the active element is switched to its on state (accessed). If the load device is passive (an impedance or an unswitched active element), the load must be a weaker conductor than the logic network and the active element, and thus the circuit speed is limited by the conductivity of the load device as is well understood.

An approach which is often used to increase the circuit speed is the use of a high-conductivity active load switched in opposition to the active element. Since the output node is connected to the supply voltage (a high level) by the active load while the circuit is not accessed, the only output transitions which need to be made when the circuit is accessed are high-to-low, which are faster owing to the high conductivity of the logic network and the active element. A disadvantage of the latter circuit is that multistage circuits require separate clocking signals to the individual stages, so that later stages are not activated until earlier stages have completed their high-to-low transitions. Otherwise, false high-to-low transitions of later stages might occur with no mechanism for recovering the desired output. The clocking requirements introduce extra components and result in somewhat slower circuit operation. The problem to which the invention is directed thus is to achieve a multistage circuit in which pull-ups are eliminated from the accessing period without necessitating separate clocking signals to the individual stages.

SUMMARY OF THE INVENTION

In accordance with the present invention, on-chip delay elements are employed between the various stages of a multistage circuit so that a single clock pulse can be used to activate all the active elements of all stages so that later stages are not inadvertently activated. Pull-ups are eliminated by, for example, switching load devices in opposition to the active elements. Importantly, a multistage logic circuit in accordance with this invention is responsive to a single clock pulse edge to take advantage of improved speed of operation permitted by the elimination of pull-ups during access.

In this connection, the term 37 pull-ups" refers to the raising of a node to a relatively high voltage level.

Since the output node in such a logic circuit always has a parasitic capacitance asssociated with it, that capacitance is used to advantage herein to hold the output node at a high voltage level during access unless the output node is pulled high-to-low through the logic network and the active element. Accordingly, a logic circuit herein includes an output node connected to a supply voltage by an active (or passive) load and to a reference potential by an active element (via a logic network). The former is turned on (then optionally, but not necessarily, turned off) prior to the activation of the active element. The output node is driven high, and kept high by the parasitic capacitance, before the active element is activated. As a consequence, the active element, the logic network and the load capacitance determine the speed of access responsive to a single clock edge. Since no low-to-high transition of the output node is necessary, higher speeds are achieved. It is an important aspect of this invention that the high speed which the circuit is capable of achieving is realized by organizing a multistage arrangement in which all the active elements are switched by a single clock pulse rather than by a sequence of clock pulses. Each such stage includes an on-chip delay circuit for avoiding "pull-ups" in the next subsequent stage.

BRIEF DESCRIPTION OF THE DRAWING

FIG. 1 is a circuit diagram of a multistage combinatorial logic arrangement in accordance with this invention;

FIG. 2 is a circuit diagram of a portion of the arrangement of FIG. 1;

DETAILED DESCRIPTION

Figure 3:
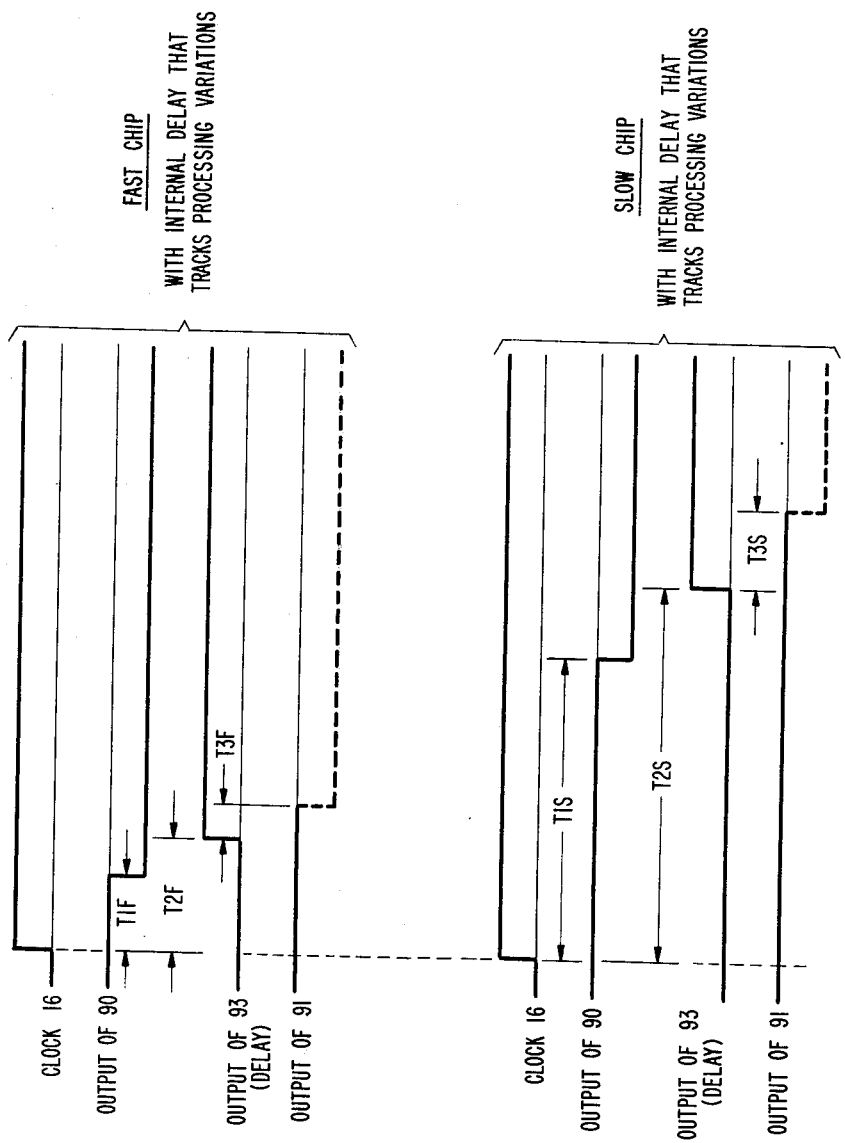
FIGS. 3 and 4 are pulse diagrams of the circuit of FIG. 1 and a like circuit with multiple clock pulses, respectively.

FIG. 1 shows an illustrative combinatorial logic integrated circuit defined in a semiconductor chip 10. The circuit comprises a plurality of stages Si (viz: $S_1$, $S_2$, ...), each including an N-channel network $12_i$ and a P-channel active load element $13_i$ connected electrically in series between the drain of an N-channel device $15_i$ and a source of voltage $V_{DD}$. The network and load elements are designated $12_1$ and $13_1$, respectively, for stage $S_1$. The source of each device $15_i$ is connected to ground and the gate is connected to a source of clock pulses 16. Network $12_i$ is connected to the drain of device $15_i$ and is electrically in series with active load $13_i$. Load $13_2$, like load $13_1$, has its source connected to voltage source $V_{DD}$.

The gates of load $13_1$ and $13_2$ are shown connected to ground in FIG. 1. Alternatively, those gates may be connected to the gates of devices $15_1$ and $15_2$, respectively. In this manner, the edge of a single clock pulse from source 16 switches elements $13_1$ and $13_2$ in opposition to devices $15_1$ and $15_2$.

FIG. 2 shows a portion of FIG. 1 illustrating the details of either of N-channel networks, $12_1$ or $12_2$. Each such network includes paths $42_i$ and $43_i$, arranged electrically in parallel between the drain of load device $13_1$ (or $13_2$) and the drain of device $15_1$ (or $15_2$). Path $42_i$ can be seen to include two N-channel devices, $47_i$ and $48_i$, the source of the former being connected to the drain of the latter. Similarly, path $43_i$, includes devices $50_i$ and $51_i$. Inputs are shown connected to the gates of each of the devices $47_i$, $48_i$, $50_i$, and $51_i$.

FIG. 1 also shows a delay circuit 20 connected between the gates of devices $15_1$ and $15_2$. Delay circuit 20 is formed on-chip during the fabrication of the circuit of FIG. 1 and is designed to include a number of N-channel devices which ensure that the circuit operates slower than any stage. To this end, the delay circuit includes a sequence of N-channel devices $61_i$, $62_i$, $63_i$, and $64_i$, shown as $61_i$, $62_i$, $63_i$, and $64_i$ for stage $S_i$ in FIG. 1. The devices are connected electrically in series source to drain as shown and having their gates connected electrically in parallel to the source of voltage $V_{DD}$. The sequence of devices $61_i$–$64_i$ is connected between the drains of P-channel device $13_D$ and N-channel device $15_D$ (where the subscript stands for "delay") forming the equivalent of a stage in FIG. 1. In this connection, devices $13_D$ and $15_D$ may be compared to devices $13_1$ and $15_1$ of stage $S_1$, and operate in an analogous manner. Note that device $15_D$ and device $15_i$ may be the same device.

The node between device $61_i$ and device $13_D$ is connected to the gate of device $15_2$ via an inverter $70_1$. Inverter $70_1$ comprises a P-channel device $71_1$ and an N-channel device $72_1$, the drain of the latter being connected to the drain of the former. The source of device $71_1$ is connected to source of voltage $V_{DD}$. The source of device $72_1$ is connected to a reference voltage, conveniently ground. The gates of devices $71_1$ and $72_1$ are connected to a node between devices $61_1$ and $13_D$. The drains of devices $71_1$ and $72_1$ are connected to the gate of device $15_2$.

Consider the operation of the circuit of FIGS. 1 and 2. We will assume an initial condition where device $15_1$ is off, and devices $13_1$ and $13_2$ are on in the illustrative circuit. Under these conditions, no current flows through the networks, and nodes 90 and 91 (of FIG. 1) are high. If node 90 is in the high state, device $47_2$ of the following stage is on.

Input signals are applied to the inputs of the devices of the N-channel networks, some typically from external sources (not shown); others from prior stages, as is clear from the figure, during ordinary operation. We assume that device $15_1$ is turned on at a time when the input signals are fixed and the devices of the N-channel networks are activated or not depending on the input signals. Either an electrical path to ground exists through the N-channel network $12_1$ or not. If not, node 90 remains high, and device $47_2$ remains on. If device $48_2$ is on at this time as a result of other inputs, and devices $50_2$ and $51_2$ are off, mode 91 goes low. If a path to ground exists in stage 1, node 90 goes low, and device $47_2$ turns off. It is apparent that a finite (nonzero) response time will be required after the clock signal transition before node 90 will be able to go low. Therefore, it is necessary that an appropriate delay be introduced to avoid premature (and erroneous) discharge at stage $S_2$. The multistage circuits of FIGS. 1 and 2 thus can be seen to be responsive to a single clock pulse to produce an output in a time determined by the speed of the pull down rather than by the illustrative relatively slow active load elements or by the frequency of a sequence of clock pulses.

Such sequences of clock pulses are illustrated in FIG. 3 for two integrated circuit chips from the slow and fast extremes of a manufacturing distribution of integrated circuit chips. Time T1F represents the response time (at mode 90 FIG. 1) of stage 1 after a clock from source signal 16. Time T3F represents the response time (at node 93 of FIG. 1) of stage $S_2$ also after a clock signal from source 16. If the two clock signals are the same, stage $S_2$ responds to the output signal (at node 90) from stage $S_1$ before that output signal stabilizes. Since the pull-up capability of the active loads may be weak (or the loads may be turned off during the active part of the cycle to reduce power consumption), stage $S_2$ could not recover from an erroneous premature discharge. Accordingly, a delay, T2F, must be installed such that T2F tracks T1F but is always slightly greater than T1F. This prevents the premature erroneous discharge of stage $S_2$.

The delay element, T2F, is implemented on-chip in order that it tracks the response time, T1F, under variations in processing. Note, for example, that the delay, T2F, in a fast (F) chip (TOP of FIG. 3) is significantly less than the delay T2s in the slow chip (BOTTOM of FIG. 3). The ability of the delay to track processing variations clearly reduces the overall response time of the fast chip compared to the time required if a fixed external delay (set to tolerate the slowest chip in the distribution) were used.

Figure 4:
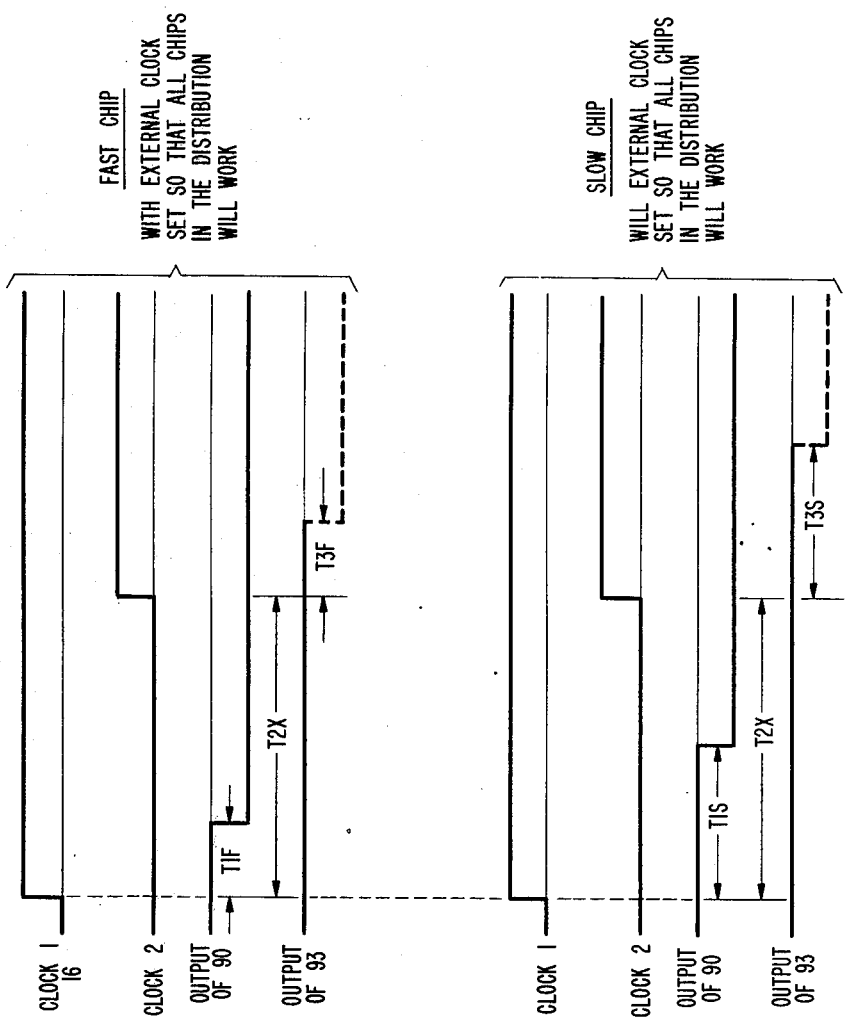

The latter alternative is illustrated in FIG. 4. In this latter case where a sequence of clock pulses is supplied, the same (long) delay, T2x, must be used for all integrated circuit chips in the manufacturing distribution (TOP and BOTTOM of FIG. 4), since it is supplied external to the chip and does not track manufacturing variations. The alternative in FIG. 4 is undesirable, since the fast chip has a longer response time by the amount of the difference (T2x-T2f).

A circuit as shown in FIGS. 1 and 2 with the following specifications was made and operated. The gates of devices $13_1$, and $13_2$ were grounded in this instance as shown in FIG. 1. The circuit was basically a "pseudo-NMOS" circuit using PMOS load devices and N-channel pull-down devices. Delays were employed as shown in FIG. 1. The total delay was equal to about 200 nanoseconds (ns), about 100 nanoseconds per stage (T1F=T3F=100, T2F=T1F) in the fastest circuits and 600 nanoseconds in the slowest (T1S=T3S=300, T2S=T1S). This is to be compared with a clocked multistage delay of more than 500 nanoseconds for fast chips (T1F=T2F=100, T2x=T1S+100 ns. margin), and 700 ns. for slow chips (T1S=T2S=300, T2x=T1S+100 ns. margin), and requiring more circuitry for implementation.

The invention has been described in terms of pseudo-NMOS integrated circuit construction. It is to be understood that this need not be the case. The invention may be implemented with PMOS, NMOS, CMOS, bipolar or any other integrated circuit technology.

Figure 5:
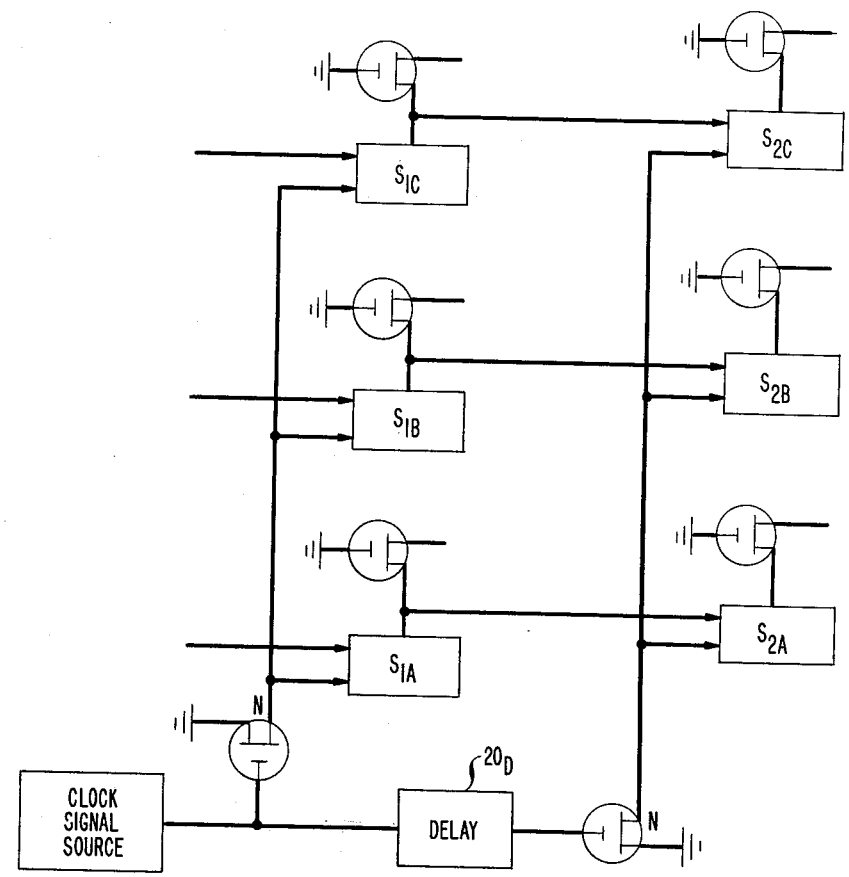
FIG. 5 is a diagram of an alternative organization in accordance with this invention.

It should be noted that the same on-chip delay circuit can be shared by several first stages operating in parallel as, for example, in the arithmetic logic unit of an 8-bit microprocessor, were eight first-stage units operate in parallel. This organization is illustrated in FIG. 5 where a delay circuit $20_D$ is shown connected in parallel with circuits $S_{1A}$, $S_{1B}$, sic. and $S_{2A}$, $S_{2B}$, $S_{2c}$ et cetera, each comprising a single stage as $S_i$ of FIG. 1.

What has been described is considered merely illustrative of the principles of this invention. Therefore, varied modifications of the invention can be devised by those skilled in the art in accordance with the principles of this invention within the spirit and scope of the invention as encompassed by the following claims.

We claim:

1. An electronic circuit with at least first and second stages, each of said stages including an output node and being connected between a supply voltage and a reference voltage for applying an output signal to a next consecutive stage, a logic network comprising a plurality of first active elements responsive to input signals for selectively connecting an associated one of said nodes to said reference voltage, each of said networks being connected to said reference voltage via a second active element, a load element connected between each of said nodes and said supply voltage, clock means for applying a single signal to said circuit for switching said second elements, said circuit including an on-chip delay means for avoiding premature switching of said second active element in said next consecutive stage, said first stage having a first characteristic response time, said delay means having a second characteristic response time greater than said first.

2. An electronic circuit in accordance with claim 1 wherein said load elements are active elements and said signal means is operative to switch said load elements in opposition to said second elements.

3. An electronic circuit in accordance with claim 2 wherein said delay means is connected between said clock signal means and the second active element of one of said stages for delaying the signal applied to said second element of at least a latter one of said stages.

4. An electronic circuit in accordance with claim 1 comprising an integrated semiconductor chip.

5. An electronic circuit in accordance with claim 1 wherein said load elements and said active element comprise P-channel and N-channel devices, respectively, and the gates of said elements are connected to a source of clock pulses.

6. An electronic circuit in accordance with claim 1 wherein said load elements are passive elements.

* * * * *